(12) United States Patent  
Ryu

(10) Patent No.: US 7,925,154 B2  
(45) Date of Patent: Apr. 12, 2011

(54) CAMERA MODULE AND METHOD OF MANUFACTURING THE SAME

(75) Inventor: Jin Mun Ryu, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 166 days.

(21) Appl. No.: 12/292,215

(22) Filed: Nov. 13, 2008

(65) Prior Publication Data

US 2010/0032781 A1    Feb. 11, 2010

(30) Foreign Application Priority Data

Aug. 8, 2008 (KR) .................. 10-2008-0077859

(51) Int. Cl.
*G03B 7/099* (2006.01)
*G03B 17/00* (2006.01)
(52) U.S. Cl. .................. 396/268; 396/439
(58) Field of Classification Search .......... 396/268, 396/439, 542
See application file for complete search history.

(56) References Cited

U.S. PATENT DOCUMENTS

| 7,439,094 | B2 * | 10/2008 | Song et al. | 438/55 |
| 7,515,817 | B2 * | 4/2009 | Shiraishi et al. | 396/89 |
| 7,614,807 | B2 * | 11/2009 | Jao | 396/529 |
| 7,651,878 | B2 * | 1/2010 | Ryu | 438/25 |
| 7,663,083 | B2 * | 2/2010 | Kwon et al. | 250/208.1 |
| 2008/0164550 | A1 * | 7/2008 | Chen et al. | 257/432 |

FOREIGN PATENT DOCUMENTS

KR    10-2006-0088189    8/2006

* cited by examiner

*Primary Examiner* — Rodney E Fuller

(57) ABSTRACT

Provided is a camera module including an image sensor module including a substrate; an image sensor that is mounted on a top surface of the substrate; a ground pad that is disposed on a bottom surface of the substrate; and a sealing member that seals the image sensor mounted on the substrate; a lens member that is stacked on the image sensor module; and a conductive member that is formed on side surfaces of the image sensor module and the lens member so as to be electrically connected to the ground pad.

1 Claim, 4 Drawing Sheets

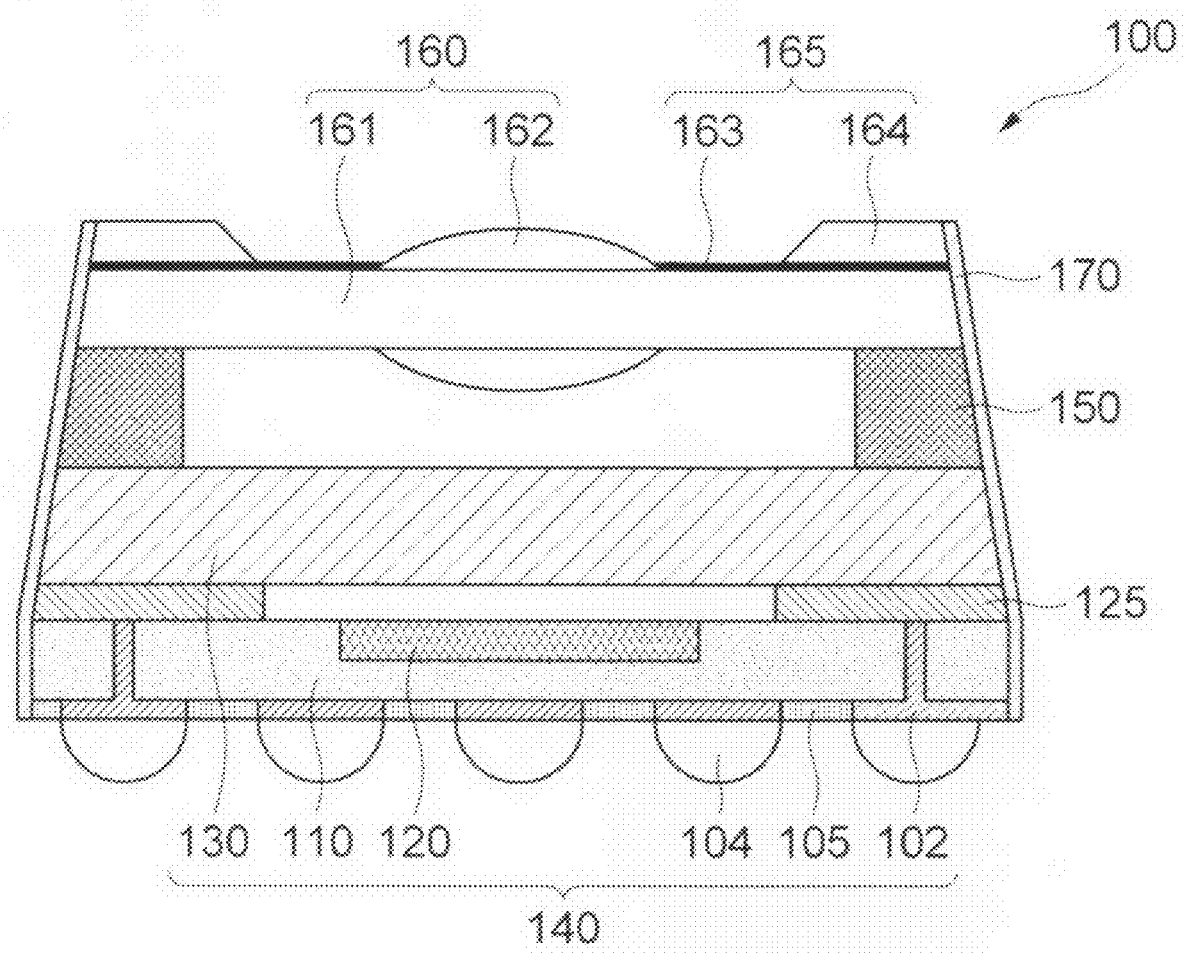

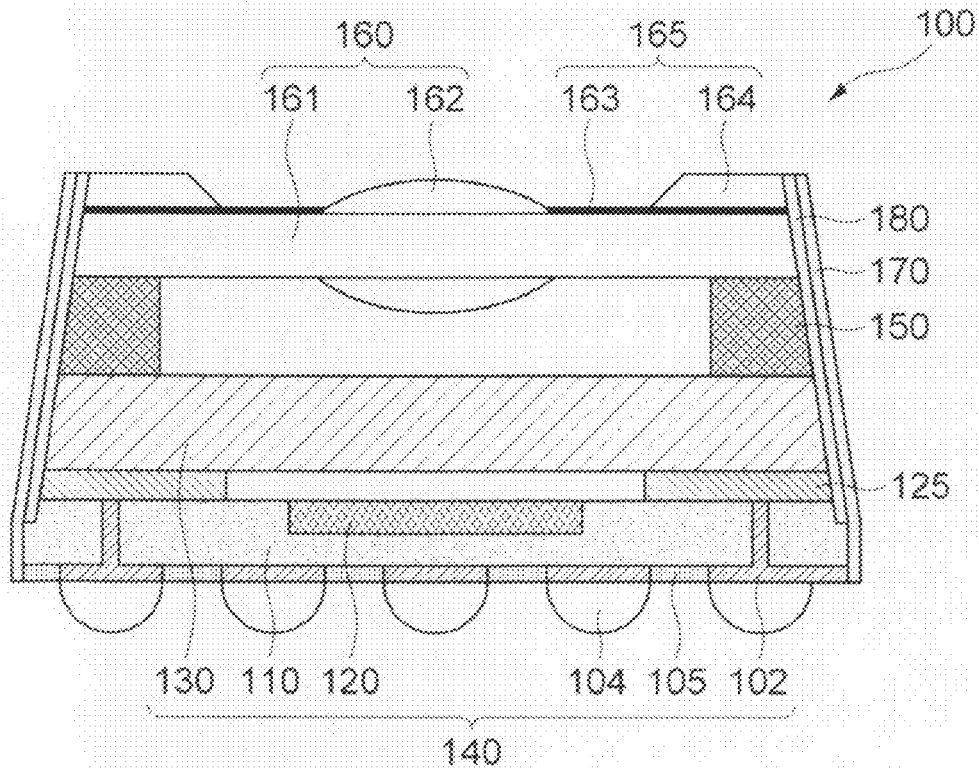
[FIG. 2]
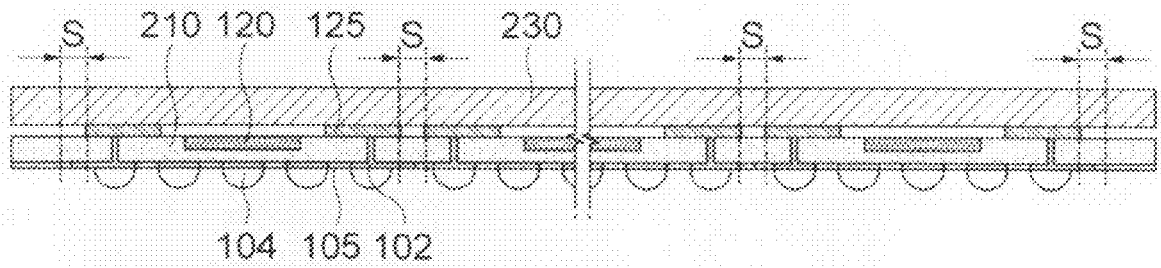
[FIG. 3]
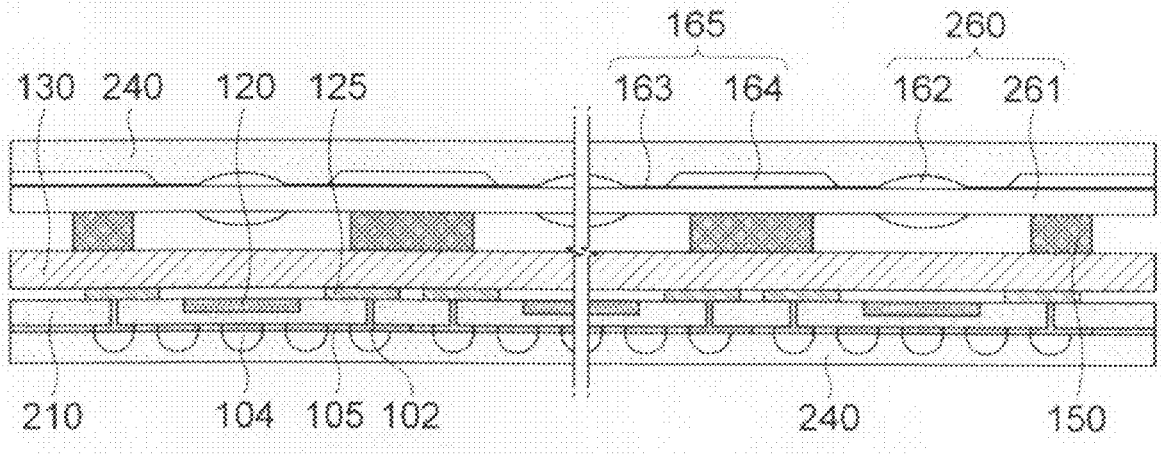
[FIG. 4]

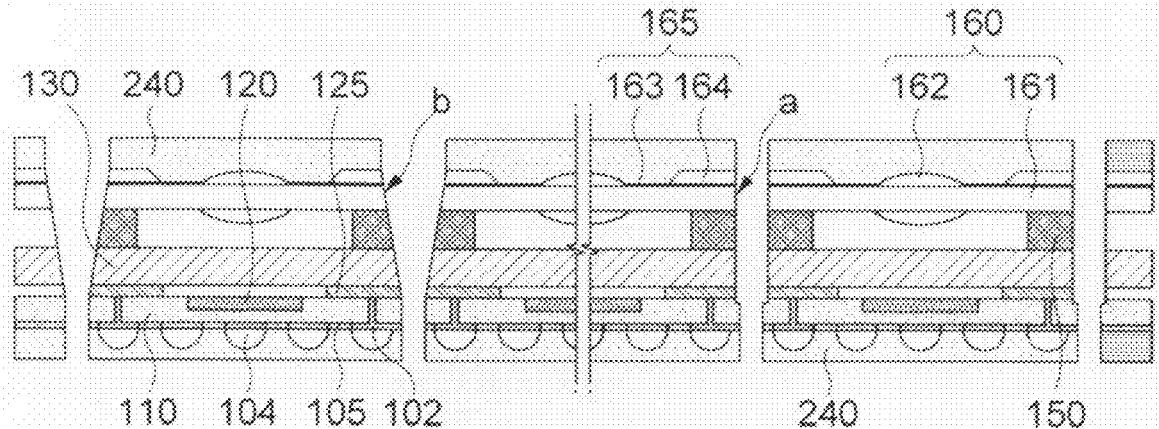
[FIG. 5]
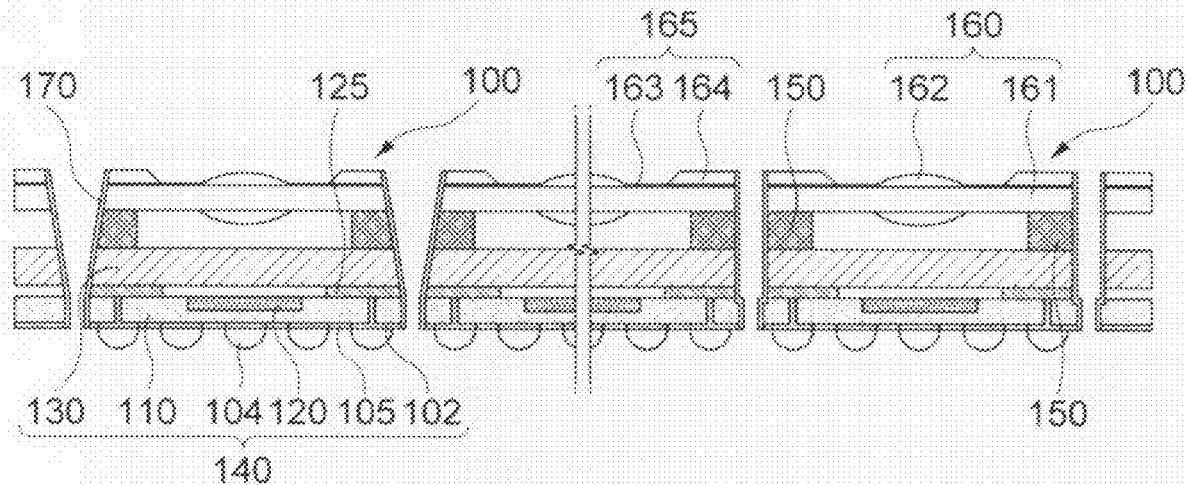
[FIG. 6]
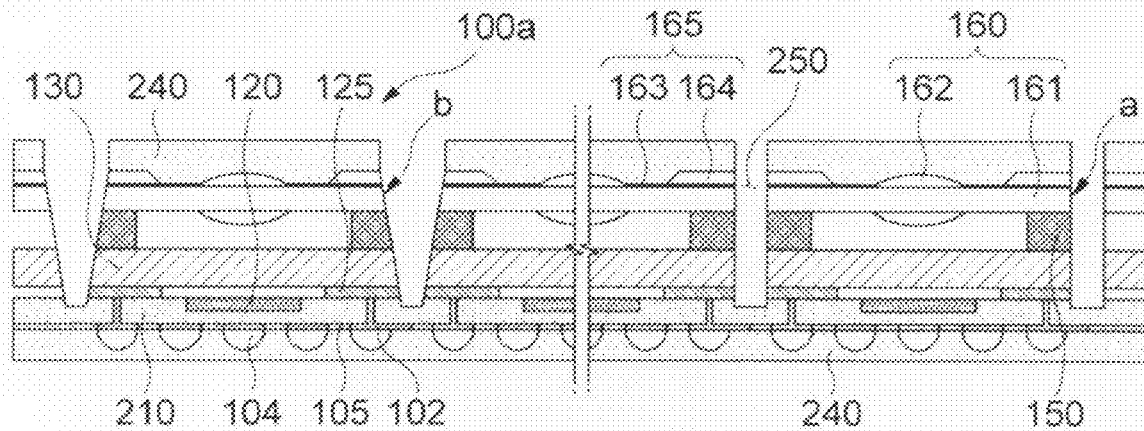
[FIG. 7]

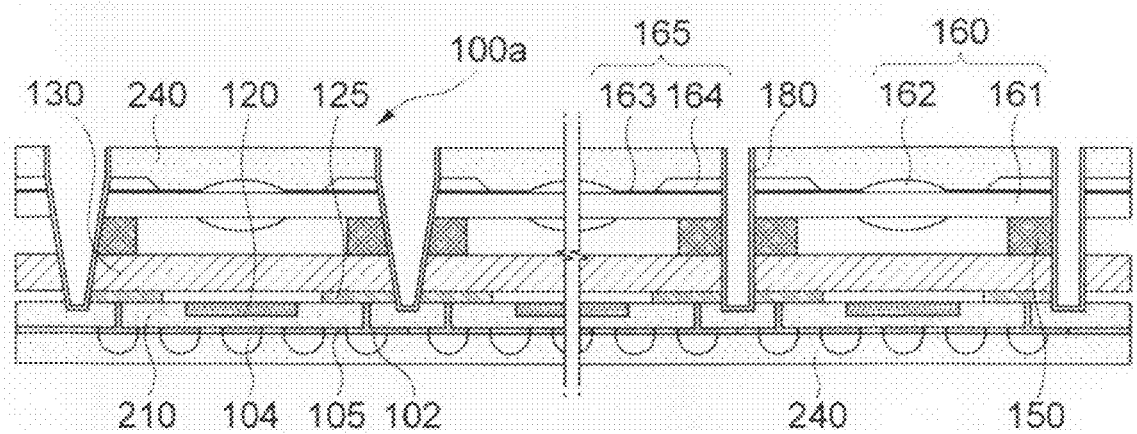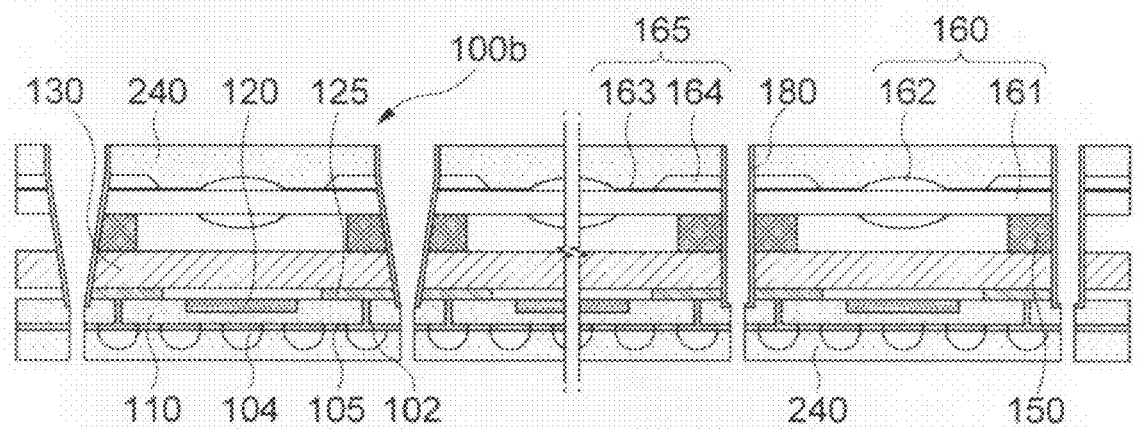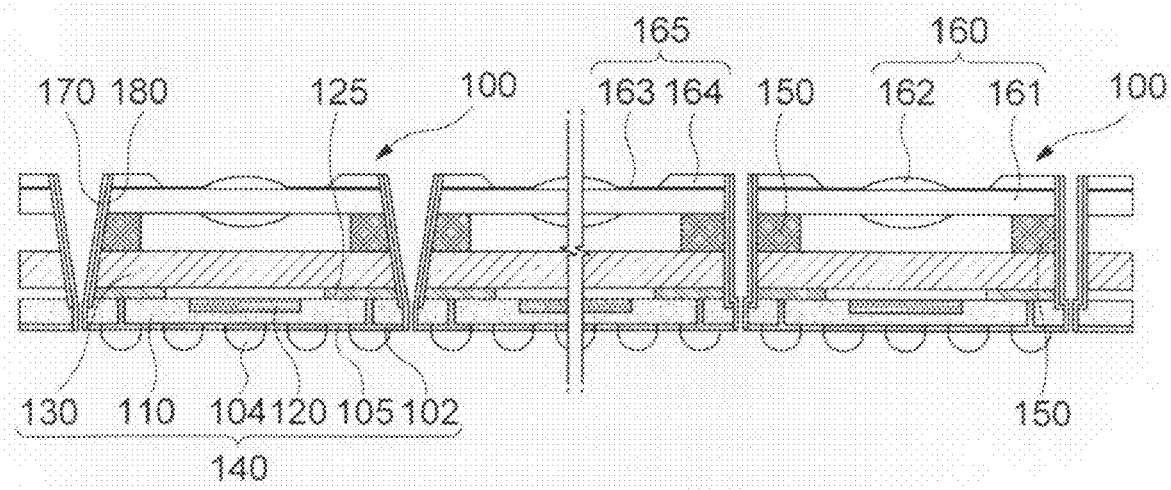

CAMERA MODULE AND METHOD OF MANUFACTURING THE SAME

CROSS-REFERENCE TO RELATED APPLICATIONS

This application claims the benefit of Korean Patent Application No. 10-2008-0077859 filed with the Korean Intellectual Property Office on Aug. 8, 2008, the disclosure of which is incorporated herein by reference.

BACKGROUND OF THE INVENTION

1. Field of the Invention

The present invention relates to a camera module and a method of manufacturing the same.

2. Description of the Related Art

Recently, camera modules are mounted on IT devices such as mobile terminals, PDAs (Personal Digital Assistant), MP3 players and so on. With the development of technology, the resolution of the camera modules changes from 300,000 pixels (VGA) to several million pixels, and the reduction in size and thickness of the camera modules are being performed depending on mounting targets. Further, the camera module provides various additional functions, such as auto-focusing (AF) and optical zoom.

In general, a compact camera module (CCM) has a small size and is applied to various IT devices such as camera phones, PDAs, and smart phones. Recently, more and more devices having a small-sized camera module mounted thereon have been launched on the market in accordance with consumers' tastes.

Such a camera module is manufactured using a charge coupled device (CCD) or complementary metal oxide semiconductor (CMOS) image sensor as a main component. Incident light transmitted through the lens is condensed by the image sensor and is stored as data in a memory. The stored data is displayed as an image through a display medium, such as liquid crystal display (LCD) or PC monitor.

Typical camera modules are manufactured by a chip-on-film (COF) method, a chip-on-board (COB) method, and a chip scale package (CSP) method, among which the COF method and the COB method are widely used.

Recently, a wafer-level camera module (WLCM) which can be mass-produced has been proposed, in order to maximize a price reduction.

The WLCM can be mass-produced because an image sensor and a lens are manufactured by a wafer level method. Further, since the WLCM can be directly mounted on a main substrate, it is possible to reduce the price of a mobile phone having the WLCM mounted therein.

To manufacture a conventional WLCM, a lens wafer is attached to a wafer having image sensors formed thereon through a bonding method. Thereafter, the wafer having the lens wafer attached thereto is diced into a plurality of unit modules. Then, an optical case of which only an incident port is opened is coupled to each of the unit modules, thereby completely manufacturing a WLCM.

At this time, to couple the optical case to the unit module, a series of processes of rearranging the optical case, applying bond, attaching the case, and curing the module should be accompanied. Therefore, the manufacturing cost may increase.

Further, when the WLCM is affected by electrostatic discharge (ESD) or electromagnetic waves caused by a mobile terminal having the WLCM mounted thereon or an electrical effect from the outside of the mobile terminal, the WLCM may malfunction or image noise may occur.

Therefore, although the WLCM has been proposed to reduce a cost, there is a limit in reducing the manufacturing cost of the WLCM, because the manufacturing process of the WLCM is complex. Further, defects may occur due to ESD or electromagnetic waves.

SUMMARY OF THE INVENTION

An advantage of the present invention is that it provides a camera module which is formed by using a wafer substrate including a ground pad extending to a scribe line and has a conductive member directly connected to the ground pad, the conductive member being formed on a side surface of the camera module. Therefore, a casing process and a bonding process of the ground pad can be performed on a wafer substrate. Accordingly, the process can be simplified in comparison with when an existing optical case is used, and defects caused by electrostatic discharge (ESD) and electromagnetic waves.

Another advantage of the invention is that it provides a method of manufacturing a camera module.

Additional aspect and advantages of the present general inventive concept will be set forth in part in the description which follows and, in part, will be obvious from the description, or may be learned by practice of the general inventive concept.

According to an aspect of the invention, a camera module comprises an image sensor module including a substrate; an image sensor mounted on a top surface of the substrate; a ground pad that is disposed on a bottom surface of the substrate; and a sealing member that seals the image sensor mounted on the substrate; a lens member stacked on the image sensor module; and a conductive member formed on side surfaces of the image sensor module and the lens member so as to be electrically connected to the ground pad.

The camera module may further include a light blocking member disposed between the conductive member and the side surfaces of the image sensor module and the lens member.

The light blocking member may contain resin or metal.

The light blocking member may expose an end of the ground pad.

An end of the ground pad and one side of the substrate may be aligned with each other.

The respective side surfaces of the image sensor module and the lens member may extend so as to be vertical or inclined at a predetermined angle with respect to the substrate.

The conductive member may contain black metal.

According to another aspect of the invention, a method of manufacturing a camera module comprises providing a wafer substrate which includes a plurality of cells defined by scribe lines, each cell including an image sensor and a ground pad extending to the scribe line; sealing the image sensor by closely attaching a wafer sealing member to a top surface of the wafer substrate; forming a wafer lens on the wafer sealing member; dividing the wafer substrate including the wafer sealing member and the wafer lens into the respective cells along the scribe lines such that an image sensor module and a lens member are formed in each of the cells; and forming a conductive member along side surfaces of the image sensor module and the lens member, the conductive member being electrically connected to the ground pad.

According to a further aspect of the invention, a method of manufacturing a camera module comprises providing a wafer substrate which includes a plurality of cells defined by scribe lines, each cell including an image sensor and a ground pad extending to the scribe line; sealing the image sensor by closely attaching a wafer sealing member to a top surface of the wafer substrate; forming a wafer lens on the wafer sealing member; forming trenches corresponding to the scribe lines on the wafer substrate including the wafer sealing member and the wafer lens; forming a light blocking member on the wafer substrate including the trenches; cutting the wafer substrate having the light blocking member formed thereon along the scribe lines such that an image sensor module and a lens member are formed in each of the cut substrates; and forming a conductive member along side surfaces of the image sensor module and the lens member, the conductive member being electrically connected to the ground pad.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a camera module according to an embodiment of the present invention;

FIG. 2 is a cross-sectional view of a camera module according to a second embodiment of the invention;

FIGS. 3 to 6 are process diagrams for explaining a method of manufacturing a camera module according to a third embodiment of the invention; and FIGS. 7 to 10 are process diagrams for explaining a method of manufacturing a camera module according to a fourth embodiment of the invention

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

FIG. 1 is a cross-sectional view of a camera module according to an embodiment of the present invention.

Referring FIG. 1, the camera module 100 includes an image sensor module 140, a lens member 160, and a conductive member 170.

The image sensor module 140 includes an image sensor 120 disposed on the top surface of a substrate 110, a ground pad 102 disposed on the bottom surface of the substrate 120, and a sealing member 130 which is disposed above the substrate 110 including the image sensor 120 and seals the image sensor 120.

The substrate 110 may be formed of silicon (Si) or a material containing silicon. In this embodiment of the invention, however, the material of the substrate 110 is not limited thereto.

The image sensor 120 may be a semiconductor element which converts an optical image into an electrical signal. For example, the image sensor 120 may be a CCD or CMOS image sensor.

The ground pad 102 may be electrically connected to ground wiring lines (not shown) disposed on the top surface of the substrate 110 through holes passing through the substrate 110. In this case, the ground wiring lines may be electrically connected to the image sensor 120. Further, the ground pad 102 may be electrically connected to an external circuit, for example, a main board of a mobile phone. Therefore, electromagnetic waves formed in the image sensor 120 can be discharged to the external circuit through the ground wiring lines and the ground pad 102. Further, static electricity applied to the camera module 100 can be discharged through the ground wiring lines and the ground pad 102.

An end of the ground pad 102 may be aligned with one side of the substrate 100. That is, the ground pad 102 may extend to the edge of the substrate 110.

The sealing member 130 may be attached to the substrate 110 through an adhesive member 125 disposed at the edge of the substrate 110. In this case, the sealing member 130 is spaced a predetermined distance from the substrate 110. Further, the sealing member 130 may be formed of a transparent material such that light can be irradiated onto the image sensor 120. For example, the sealing member 130 may be formed of glass.

The substrate 110 has electrical connection elements 104 formed on the bottom surface thereof, the electrical connection elements 104 being electrically connected to an external circuit, for example, a main board of a mobile phone. The electrical connection elements 104 may be solder balls, bumps, or pads. Further, the substrate 110 may have an insulating layer 105 formed on the bottom surface thereof, the insulating layer 105 exposing the electrical connection elements 104.

The lens member 160 may include a support plate 161 and lenses 162 disposed on the top and bottom surfaces of the support plate 161. The support plate 161 may be a transparent substrate. The lenses 162 may be formed in a spherical or hemispherical shape. The lenses 162 may be symmetrically disposed with the support plate 161 being interposed therebetween. In this embodiment of the invention, however, the shape of the lenses 162 is not limited thereto, and the lenses 162 may be formed so as to have a different size and shape from each other. The lens 162 may be disposed on only the top or bottom surface of the support plate 161.

Between the lens member 160 and the image sensor module 140, a spacer 150 is provided so as to constantly maintain a distance between the lens member 160 and the image sensor module 140. In this case, a distance between the lens member 160 and the top surface of the image sensor module 140, that is, a focal distance may be determined by the spacer 150.

In this embodiment, it has been described that one lens member 160 is stacked. Without being limited thereto, however, two or more lens members 160 may be stacked.

Further, an iris member 165 may be provided on the lens member 160. The iris member 165 serves to block light incident on an undesirable region. The iris member 165 may include a first iris 163 and a second iris 164. The first iris 163 may be a black pattern which exposes the lens 162 and is disposed on the lens member 160, that is, the support plate 161. The black pattern may be formed of black resin which blocks light. The second iris 164 is disposed on the first iris 163 so as to protrude upward and may have a side surface inclined with respect to the lens 162. That is, the second iris 164 may have a cross-sectional shape of which the inner diameter decreases toward the lower portion thereof. Accordingly, the second iris 164 causes light to be concentrated on the lens 162. In this embodiment of the invention, it has been described that the iris member 165 includes the first and second irises 163 and 164. Without being limited thereto, however, the iris member 165 may include only one of the first and second irises 163 and 164.

The image sensor module 140 and the lens member 160 are integrally stacked. Accordingly, the camera module 100 may be formed so as to have a small size.

The image sensor module 140 and the lens member 160 extend in such a manner that at least one side surfaces thereof are formed vertically or inclined at a predetermined angle with respect to the substrate 110. The predetermined angle may be an acute angle. The side surface having the slope can stabilize the electrical connection between the ground pad 102 and the conductive member 170 which will be described below. Further, the vertical side surface may be formed through a proper process. The image sensor module 140 and the lens member 160 may have a variety of cross-sectional shapes in consideration of the ease and stabilization of the process. For example, the image sensor module 140 and the lens member 160 may be formed to have a rectangular cross-sectional structure of which both side surfaces are vertical or a trapezoidal cross-sectional structure of which both side surfaces are inclined at a predetermined angle. Alternatively, the image sensor module 140 and the lens member 160 may have a rectangular trapezoidal cross-sectional structure of which one side surface is vertical and the other side surface is inclined at a predetermined angle.

As the conductive member 170 is formed so as to cover the end surface of the ground pad 102, the conductive member 170 may be directly connected to the ground pad 102. That is, the conductive member 170 may be electrically connected to the ground pad 102. Accordingly, when static electricity is formed in the camera module 100 by an external environment, the static electricity may be discharged through the conductive member 170 and the ground pad 102. Further, the conductive member 170 serves to cut off electromagnetic waves transmitted to the inside from the outside of the camera module 100.

The conductive member 170 may be disposed on the side surfaces of the image sensor module 140 and the lens member 160. Further, the conductive member 170 extends to the side surface of the iris member 165. That is, the conductive member 170 may be formed so as to coverall the side surfaces of the image sensor module 140, the lens member 160, and the iris member 165 which are stacked. Accordingly, an area occupied by the conductive member 170 may increase, thereby making it possible to enhance a static-electricity or electromagnetic-wave shielding effect.

The conductive member 170 may be formed of a material with conductivity. For example, the conductive member 170 may be formed of metal. More specifically, the conductive member 170 may be formed of black metal such as chrome or nickel. Accordingly, in the camera module, external light can be blocked by the conductive member 170 so as not to permeate into the camera module, and light can be prevented from being reflected inside the camera module. Therefore, the camera module does not need to have a separate case.

The conductive member 170 may further include a single-layer film composed of any one selected from the group consisting of Cu, Ag, stainless steel (SUS), structural steel (SS), and Al or a multi-layer film composed of two or more selected from the group.

Although not shown, the camera module 100 may further include a filter member. The filter member is disposed on the image sensor 120 so as to cut off infrared rays incident on the image sensor 120. For example, the filter member may be disposed on or under the sealing member 130, or may be disposed on or under the lens member 160.

As described above, the camera module 100 includes the ground pad 102 provided on the bottom surface of the substrate 110, and the ground pad 102 is directly connected to the conductive member 170 disposed on the side surfaces of the image sensor module 140 and the lens member 160 which are stacked. Therefore, it is possible to prevent defects of the camera module caused by static electricity and electromagnetic waves.

Further, since the conductive member 170 is formed of a material which cuts off light, the reflection of light inside the camera module 100 and the permeation of light from outside can be prevented without a separate case provided on the camera module. Therefore, it is possible to reduce the size of the camera module.

FIG. 2 is a cross-sectional view of a camera module according to a second embodiment of the invention.

The camera module according to the second embodiment of the invention has almost the same construction as that of the first embodiment, except for a light blocking member. Therefore, like reference numerals will be attached to the same components as those of the first embodiment, and the duplicated descriptions thereof will be omitted.

Referring to FIG. 2, the camera module 100 according to the second embodiment of the invention includes an image sensor module 140, a lens member 160, and a conductive member 170. The image sensor module 140 includes an image sensor 120 disposed on the top surface of a substrate 110, a ground pad 102 disposed on the bottom surface of the substrate 110, and a sealing member 130 which is disposed above the substrate 110 including the image sensor 120 so as to seal the image sensor 120. The lens member 160 is stacked on the image sensor module 140. The conductive member 170 is electrically connected to the ground pad 102 so as to cut off static electricity and electromagnetic waves and is disposed on side surfaces of the image sensor module 140 and the lens member 160, which are stacked.

The conductive member 170 may be formed of a conductive material. For example, the conductive member 170 may be formed of a single-layer film composed of any one selected from the group consisting of Ni, Cu, Ag, SUS, SS, and Al or a multi-layer film composed of two or more selected from the group. For the multi-layer film, Ni/Au, SUS/Cu/Ag/SUS, Ag/Cu, Cu/Ni, Al/Cu, or SS/Cu may be taken as an example.

The camera module 100 further includes a light blocking member 180 disposed between the conductive member 170 and the side surfaces of the image sensor module 140 and the lens member 160 which are stacked. The light blocking member 180 serves to prevent light from being reflected inside the camera module 100 and external light from permeating into the camera module 100.

The light blocking member 180 may be formed of resin or metal which blocks light. For example, the resin may include black resin, and the metal may include black metal. For the black metal, Cr and Ni may be taken as an example.

When the light blocking member 180 may be formed of resin, the ground pad 102 which is electrically connected to the conductive member 170 is partially exposed to implement the electrical connection between the conductive member 170 and the ground pad 102. The exposed portion of the ground pad 102 may be an end of the ground pad 102 which is aligned with the edge of the substrate 110.

Since the camera module 100 includes the light blocking member 180, the reflection of light inside the camera module and the permeation of light from the outside of the camera module can be prevented without a separate case provided thereon. Therefore, it is possible to reduce the size of the camera module.

Further, as the light blocking member 180 exposes the ground pad 102, the electrical contact stability between the conductive member 170 and the ground pad 102 can be enhanced.

FIGS. 3 to 6 are process diagrams for explaining a method of manufacturing a camera module according to a third embodiment of the invention.

First, referring to FIG. 3, a wafer substrate 210 is provided, which includes a plurality of cells defined by a scribe line S. Each cell of the wafer substrate 210 has an image sensor 120 provided on the top surface thereof and a ground pad 102 formed on the bottom surface thereof, the ground pad 102 extending to the scribe line S. Further, the wafer substrate 210 has a plurality of through-holes passing through the wafer substrate 210, and the ground pad 102 may be electrically connected to ground wiring lines disposed on the bottom surface of the wafer substrate 210 through some of the through-holes. Further, the image sensor 120 may be electrically connected to electrical connection elements 104 disposed on the bottom surface of the wafer substrate 210 through the other through-holes.

After the wafer substrate 210 is provided, a wafer sealing member 230 is attached to the top surface of the wafer substrate 210 through an adhesive element 125, in order to seal the image sensor 120 from outside. The wafer sealing member 230 may be a transparent substrate.

A wafer lens 260 including a plurality of cells is attached to the top surface of the wafer sealing member 130. Further, the wafer lens 126 includes lenses 162 disposed on the top and bottom surfaces of a wafer support plate 261 corresponding to each cell of the wafer lens 260.

Further, an iris member 165 may be disposed on the wafer lens 260. The iris member 165 may include a first iris 163 exposing the lens 162 and a second iris 164 disposed on the first iris 163. The first iris 163 may be formed by applying black resin and then performing a photolithography and developing process. The second iris 164 may be disposed on the first iris 163 so as to protrude upward and may have a side surface inclined with respect to the lens 162. That is, the second iris 164 may be formed to have a cross-sectional shape of which the inner diameter decreases toward the lower portion thereof.

Between the wafer sealing member 230 and the wafer lens 260, a spacer 150 is provided so as to constantly maintain a distance between the image sensor 120 and the lens member 160.

Further, protective films 240 may be formed on the top surface of the wafer lens 260 and the bottom surface of the wafer substrate 210, respectively. The protective films 240 may be formed through a lamination method. The protective films 240 serve to protect the lenses 162 and the electrical connection elements 104 in a process of cutting the wafer substrate 210 into a plurality of cells.

Referring to FIG. 5, the wafer substrate 210 including the wafer sealing member 230 and the wafer lens 260 is divided into the plurality of cells, each of which includes the image sensor module 140 and the lens member 160 which are stacked. Further, the iris member 165 disposed on the wafer lens 260 may be divided for each cell.

The image sensor module 140 and the lens member 160 may have a side surface (a) extending vertically with respect to the substrate 110. In this case, the cutting process may be more easily performed than when the side surface (a) is formed in a different shape. Alternatively, the image sensor module 140 and the lens member 160 may have a side surface (b) inclined at a predetermined angle with respect to the substrate 110. The predetermined angle may be an acute angle. The side surface (b) inclined at the predetermined angle extends to an end of the ground pad 102. Accordingly, the electrical connection between the end of the ground pad 102 and a conductive member 170 may be achieved more stably in a subsequent process of forming the conductive member 170.

In the cutting process, the image sensor module 140 and the lens member 160 may be formed so as to have a variety of cross-sectional shapes in consideration of the ease and stabilization of the process. For example, the image sensor module 140 and the lens member 160 may be formed to have a rectangular cross-sectional structure of which both side surfaces are vertical or a trapezoidal cross-sectional structure of which both side surfaces are inclined at a predetermined angle. Alternatively, the image sensor module 140 and the lens member 160 may have a rectangular trapezoidal cross-sectional structure of which one side surface is vertical and the other side surface is inclined at a predetermined angle.

In the cutting process, the ground pad 102 extending to the scribe line S is cut together such that the end of the ground pad 102 is aligned with the side surfaces of the image sensor module 140 and the lens member 160 which are stacked.

Referring to FIG. 6, the conductive member 170 is formed on the side surfaces of the image sensor module 140 and the lens member 160. In this case, the conductive member 170 is formed so as to cover the end of the ground pad 102 such that the conductive member 170 and the ground pad 102 are electrically connected to each other.

The conductive member 170 may be formed by applying or depositing a conductive material. The conductive material may be black metal which blocks light. For the black metal, chrome or nickel may be taken as an example. Accordingly, the conductive member 170 can prevent external light from permeating into the camera module 100 and light from being reflected inside the camera module 100. Further, the conductive member 170 may include a single-layer film composed of any one selected from the group consisting of Cu, Ag, SUS, SS, and Al or a multi-layer film composed of two or more selected from the group.

Thereafter, the protective films 240 are removed, thereby completely manufacturing the camera module.

According to the method of manufacturing a camera module, since the casing process and the bonding process of the ground pad are performed on the wafer substrate, it is possible to reduce the size of the camera module, the number of processes, and the manufacturing cost, compared with when the conventional optical case is used.

Further, as the conductive member electrically connected to the ground pad is provided outside the camera module, it is possible to prevent defects caused by electrostatic discharge (ESD) and electromagnetic waves.

FIGS. 7 to 10 are process diagrams for explaining a method of manufacturing a camera module according to a fourth embodiment of the invention.

The fourth embodiment has almost the same construction as that of the third embodiment, except for a process of forming a light blocking member. Accordingly, the duplicated descriptions will be omitted.

Referring to FIG. 7, a wafer substrate 210, a wafer sealing member 230, and a wafer lens member 260 are provided. The wafer substrate 210 includes a plurality of cells defined by scribe lines. Each cell of the wafer substrate 210 includes an image sensor 120 and a ground pad 102 extending to the scribe line. The wafer sealing member 230 is attached on the wafer substrate 210. The wafer lens member 260 is disposed on the wafer sealing member 230.

A plurality of trenches 250 corresponding to the scribe lines are formed on the wafer substrate 210 including the wafer sealing member 230 and the wafer lens 260. Accordingly, a plurality of first preliminary camera modules 100a are formed by the trenches 250. The first preliminary camera modules 100a are connected to each other through the wafer substrate 210 and are divided into the respective cells. Each of the first preliminary camera modules 100a may include an iris member 165 disposed on a lens member 160 obtained by dividing the wafer lens member 260 for each cell.

The trench 250 may have a side surface (a) or (b) which is vertically formed or inclined with respect to the wafer substrate 210.

Referring to FIG. 8, a light blocking member 180 is formed on the wafer substrate 210 including the trench 250. That is, the light blocking member 180 is formed so as to cover the side surface of the first preliminary camera module 100a.

The light blocking member 180 may be formed of resin or metal which blocks light. For example, the light blocking member 180 may be formed of black resin or black metal. The light blocking member 180 may be formed through a coating method or deposition method.

Referring to FIG. 9, the wafer substrate 210 on which the light blocking member 180 is formed is cut along the scribe lines so as to form second preliminary camera modules 100b which are divided into a plurality of cells. Each of the second preliminary camera modules 100b include the image sensor module 140 and the lens member 160 stacked on the image sensor module 140. Furthermore, the second preliminary camera module 100b may include an iris member 165 disposed on the lens member 160. In this case, the ground pad 102 extending to the scribe line may be cut together. Accordingly, the edge of the substrate 110 and the end of the ground pad 102 are aligned with each other, and the end of the ground pad 102 is exposed from the light blocking member 180.

Referring to FIG. 10, a conductive member 170 is formed. The conductive member 170 is disposed on either side surface of the second preliminary camera module 100b including the light blocking member 180 and is directly connected to the exposed portion of the ground pad 102. That is, the conductive member 170 is formed on the outer surface of the light blocking member 180.

The conductive member 170 may be formed by applying or depositing a conductive material. The conductive member 170 may be formed of a single-layer film composed of any one selected from the group consisting of Cu, Ag, SUS, SS, and Al or a multi-layer film composed of two or more selected from the group.

Thereafter, the protective films 240 of the second preliminary camera module 100b are removed, thereby completely manufacturing the camera module 100.

According to the method of manufacturing a camera module, since the casing process and the bonding process of the ground pad 102 are performed on the wafer substrate 210, it is possible to the size of the camera module 100, the number of processes, and the manufacturing cost, compared with when the conventional optical case is used.

Further, as the conductive member 170 electrically connected to the ground pad 102 is provided outside the camera module 100, it is possible to prevent defects caused by ESD and electromagnetic waves.

Further, as the light blocking member 180 is formed so as to expose the ground pad 102, it is possible to reduce an effect applied to the electric contact between the conductive member 170 and the ground pad 102, which is caused by the light blocking member 180.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A camera module comprising:
   an image sensor module including
      a substrate,
      an image sensor mounted on a top surface of the substrate,
      a ground pad disposed on a bottom surface of the substrate, and
      a sealing member that seals the image sensor mounted on the substrate;
   a lens member stacked on the image sensor module;
   an iris member formed on the lens member,
   the iris member comprising a first iris that is a black pattern which exposes the lens and a second iris that is disposed on the first iris having a side surface inclined with respect to the lens; and
   a conductive member formed on side surfaces of the image sensor module, the lens member and the iris member, and electrically connected to the ground pad.

* * * * *